(12) United States Patent
Gopinath et al.

(10) Patent No.: US 9,360,543 B2
(45) Date of Patent: Jun. 7, 2016

(54) SYSTEM AND METHOD FOR PARALLEL MAGNETIC RESONANCE IMAGE RECONSTRUCTION USING DIGITAL BEAMFORMING

(71) Applicants: Anand Gopinath, Wayzata, MN (US); Emad S. Ebbini, Edina, MN (US); John Thomas Vaughan, Stillwater, MN (US); Lance DelaBarre, St. Anthony, MN (US)

(72) Inventors: Anand Gopinath, Wayzata, MN (US); Emad S. Ebbini, Edina, MN (US); John Thomas Vaughan, Stillwater, MN (US); Lance DelaBarre, St. Anthony, MN (US)

(73) Assignee: REGENTS OF THE UNIVERSITY OF MINNESOTA, MINNEAPOLIS, MN (US)

(*) Notice: Subject to any disclaimer, the term of this patent is extended or adjusted under 35 U.S.C. 154(b) by 669 days.

(21) Appl. No.: 13/866,735

(22) Filed: Apr. 19, 2013

(65) Prior Publication Data

US 2013/0278260 A1    Oct. 24, 2013

Related U.S. Application Data

(60) Provisional application No. 61/635,631, filed on Apr. 19, 2012.

(51) Int. Cl.
*G01V 3/00* (2006.01)
*G01R 33/56* (2006.01)
*G01R 33/3415* (2006.01)

(52) U.S. Cl.
CPC ............ *G01R 33/56* (2013.01); *G01R 33/3415* (2013.01); *G01R 33/5608* (2013.01)

(58) Field of Classification Search
CPC ........................................................ G01R 33/56
USPC .......................... 324/309, 307, 306, 318, 322
See application file for complete search history.

(56) References Cited

U.S. PATENT DOCUMENTS

| | | | | |
|---|---|---|---|---|
| 6,771,067 B2* | 8/2004 | Kellman | ............ | G01R 33/5611 324/307 |
| 7,352,181 B2* | 4/2008 | Vittorio | .............. | G01R 33/3415 324/307 |
| 2015/0087522 A1* | 3/2015 | Kawaguchi | .............. | H01Q 1/38 505/163 |
| 2016/0012569 A1* | 1/2016 | Hanada | ................ | A61B 5/7246 382/131 |

OTHER PUBLICATIONS

Adriany, et al., Transmit and Receive Transmission Line Arrays for 7 Tesla Parallel Imaging, Magnetic Resonance in Medicine, 2005, 53(2):434-445.
Ballard, et al., Adaptive Transthoracic Refocusing of Dual-Mode Ultrasound Arrays, IEEE Trans. Biomed. Eng., 2010, 57(1):93-102.
(Continued)

*Primary Examiner* — Louis Arana
(74) *Attorney, Agent, or Firm* — Quarles & Brady, LLP

(57) ABSTRACT

Systems and methods for beamforming algorithms for transmit-receive parallel magnetic resonance imaging ("pMRI") applications are described. For any transmit configuration (e.g., using a single or multiple transmit elements) a weighted sum of the complex image data from each receiver is formed with a spatially-varying weighting. The weighting factor is obtained by solving an optimal refocusing problem at a set of points in the image space, which can include all the pixels in the image. The optimal refocusing of the transmit-receive configuration accounts for the spatially-varying SNR in deriving the coefficients of the weighted sum at every image pixel.

20 Claims, 2 Drawing Sheets

(56) References Cited

OTHER PUBLICATIONS

Bammer, et al., Current Concepts and Advances in Clinical Parallel Magnetic Resonance Imaging, Topics in Magnetic Resonance Imaging, 2004, 15(3):129-158.

Gopinath, et al., IMSRM, 2012.

Roemer, et al., The NMR Phased Array, Magnetic Resonance in Medicine, 1990, 16:192-225.

Setsompop, et al., Broadband Slab Selection with B1+ Mitigation at 7T Via Parallel Spectral-Spatial Excitation, Magnetic Resonance in Medicine, 2009, 61(2):493-500.

Vaughan, et al., High Frequency Volume Coils for Clinical NMR Imaging and Spectroscopy, Magnetic Resonance in Medicine, 1994, 32(2):206-218.

Walsh, et al., Adaptive Reconstruction of Phased Array MR Imagery, Magnetic Resonance in Medicine, 2000, 43:682-690.

* cited by examiner

US 9,360,543 B2

SYSTEM AND METHOD FOR PARALLEL MAGNETIC RESONANCE IMAGE RECONSTRUCTION USING DIGITAL BEAMFORMING

CROSS-REFERENCE TO RELATED APPLICATIONS

This application claims the benefit of U.S. Provisional Patent Application Ser. No. 61/635,631, filed on Apr. 19, 2012, and entitled "Digital Beam Forming in the MRI."

STATEMENT REGARDING FEDERALLY SPONSORED RESEARCH

This invention was made with government support under EB006835 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for parallel MRI image reconstruction using digital beamforming that accounts for the directivity of transmit and receive radio frequency ("RF") elements, such as RF coils or RF antennas, used to obtain magnetic resonance signals.

Parallel MRI ("pMRI"), together with the wider availability of high field MRI, promise to bring about major improvements in the sensitivity and specificity and open the door for numerous clinical applications. The introduction of pMRI has spurred interest in optimal beamforming, but much of the focus of the early work was on the use of multiple independent RF receiver coils. Methods like the root of sum of squares ("RSS") were shown to provide acceptable performance. The argument was that combining the images as a sum-of-squares results in high SNR as long as at least one of array coils has high SNR with all the coils having similar noise. However, the problem of combining image pixels from arrays with different type of image artifacts remains a challenge.

Adaptive reconstruction of using phased arrays was described by D. O. Walsh, et al., in "Adaptive Reconstruction of Phased Array MR Imagery," *Magn Reson Med*, 2000; 43(5): 682-690. Walsh presented several example reconstructions comparing the adaptive approach to RSS. The key advantages for adaptive reconstruction demonstrated by Walsh was the improvement of SNR in dark regions of the field-of-view and suppression of artifacts by adaptive nulling. The adaptive nulling was achieved by computing the noise covariance matrix from a region in the FOV where motion and/or flow artifacts are present. The adaptive approach finds an optimal complex vector, m, that is obtained from solving an eigenvalue problem for the matrix $R_n^{-1} R_s$, where $R_s$ and $R_n$ are, respectively, the signal and noise correlation matrices. These matrices can be estimated on a pixel-by-pixel or regional basis, depending on the problem. In practice, the signal and noise correlation matrices are estimated using complex image (or noise calibration) data from the array coils in a specified region of interest, $$\hat{R}(p, q) = \sum_{(x,y) \in ROI} C_p(x, y) C_q^*(x, y) \text{ for } p, q = 1, \dots, n_c; \quad (1)$$

where $C_p(x,y)$ is the complex image (or noise) data at pixel (x,y) formed by coil p, and $n_c$ is the number of coils. A common feature of the RSS and the adaptive methods relying on the complex data (noise) measurements is that the transmitter and receiver geometries are not explicitly used in image reconstruction. This can be seen as an advantage given that the radiation and reception patterns of the array elements can be complicated, especially with the subject present.

SUMMARY OF THE INVENTION

The present invention overcomes the aforementioned drawbacks by providing systems and methods for reconstructing images using a magnetic resonance imaging ("MRI") system that includes an array of radio frequency ("RF") elements, such as coils or antennas, and a beamforming algorithm that explicitly accounts for the directivities of the RF elements.

It is an aspect of the invention to provide a method for producing an image of a subject with an MRI system that includes acquiring data from the subject by generating RF energy with at least one transmit RF element and measuring magnetic resonance signals formed in response thereto with at least two receive RF elements. A directivity for each of the at least two receive RF elements is determined and an image corresponding to each of the at least two receive RF elements is reconstructed by reconstructing data acquired by the respective receive RF element. An image of the subject is then produced by combining the reconstructed images using the directivities for the at least two receive RF elements.

It is another aspect of the invention to provide a method for producing an image of a subject with an MRI system that includes an array of RF elements, such as coils or antennas. RF energy is transmitted to the subject using one or more of the elements in the array of RF elements, and data is acquired with the array of RF elements by measuring magnetic resonance signals formed in response to the transmitted RF energy. A transmit directivity and a receive directivity are provided for each RF element in the array of RF elements. An image is reconstructed for each RF element in the array of RF elements by reconstructing data associated with magnetic resonance signals detected by the respective RF element. An image of the subject is then produced by combining the reconstructed images using the provided directivities.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
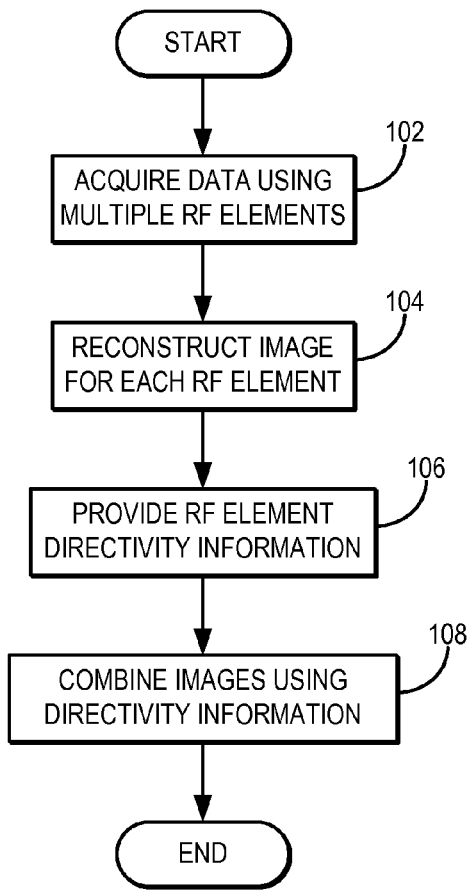
FIG. 1 is a flowchart setting forth the steps of an example of a method for reconstructing an image of a subject using a beamforming algorithm that accounts for directivities of transmit and/or receive radio frequency ("RF") elements, such as coils or antennas.

Described here are systems and methods for reconstructing images of a subject, whether a human, animal, sample, or inanimate object, from data obtained with parallel magnetic resonance imaging ("pMRI") in which one or more radio frequency ("RF") transmit elements and two or more RF receive elements are used to generate and measure magnetic resonance signals. The transmit and receive RF elements may be RF coils or RF antennas. Images are reconstructed using digital beamforming techniques that account for the directivity of the transmit and receive RF elements used to acquire data from the subject.

Digital beam forming of received signals in MRI systems is a new paradigm for image processing. In digital beam forming, the transmitted signals are not weighted, but the receive signals are amplified, down-converted to an intermediate frequency ("IF"), digitized, and processed. The total information available over the entire field of view is preserved. These digitized signals are multiplied by complex weights, Fourier transformed, and summed to produce the weighted image. Alternatively the weighting may be performed in the image domain instead of the k-space weighting. The weighting may result in different effects, including a single beam focused at a region of interest ("ROI"), or closely spaced multiple beams resulting in a wider ROI, RF element pattern correction including mitigating mutual coupling effects, nulling in a specific region, among others.

The present invention does not require any additional resources or any changes to the hardware configuration of conventional MRI equipment. Rather, the present invention is completely digital and makes use of RF coil, or antenna, directivities in free space, which can be readily computed, measured, or estimated. The present invention, thus, can be implemented with any conventional pMRI system with either receive-only or transmit-receive operational capabilities.

A beamforming algorithm for combining complex image data acquired with a pMRI acquisition is thus provided. The algorithm utilizes transmit and receive RF element directivity patterns at each image pixel to compute a spatially-varying weighting for combining the complex image data from different receive elements. Compared to the RSS method described above, the beamforming algorithm described here reduces the size of the dark regions in the image without amplifying the noise.

Compared to the adaptive matched filter reconstruction and least squares methods described above, the beamforming algorithm described here employs a spatial inverse filter derived from the transmit-receive directivities to equalize the array gain at each pixel. Moreover, the gain of the spatial inverse filter is inversely proportional to the square root of the SNR, allowing for the optimization of this quantity at every pixel, or in generalized regions, of the image.

Generally speaking, the principles of beamforming can be applied to image reconstruction in pMRI. Described here are systems and methods for implementing beamforming to reconstruction images from data acquired using pMRI techniques. As will be described below, the systems and methods incorporate information about the directivity of the RF elements used to transmit RF energy to the subject and of the RF elements that detect and receive magnetic resonance signals in response thereto. As such, the systems and methods of the present invention can be used for receive-only beamforming and transmit-receive beamforming. These two approaches are now described in turn.

Bistatic transmission and reception of RF electromagnetic radiation can be formulated because of the reciprocity of electromagnetic waves. The received RF data, s(t), can be represented by $$s(t)=M_0\int_V \rho(\vec{r})\exp(-j\gamma\int_0^t \vec{G}(t')\cdot\vec{r}\,dt')d\vec{r} \qquad (2);$$

where $M_0$ is longitudinal magnetization in equilibrium; $\rho$ is the spin density; $\gamma$ is the gyromagnetic ratio; and $\vec{G}(t)$ is the time-dependent three-dimensional vector gradient field, with $$\vec{G}(t)=+G_x\hat{x}+G_y\hat{y}+G_z\hat{z} \qquad (3).$$

The spin density, $\rho$, is proportional to the transmit RF field, $B_1^+(\vec{r})$ and the receive RF field, $B_1^-(\vec{r})$, and, depending on the imaging protocol, the T1 and T2 weighting functions, $$\exp\left(-\frac{TE}{T_2(\vec{r})}\right) \text{ and } 1-\exp\left(-\frac{TR}{T_1(\vec{r})}\right). \qquad (4)$$

Depending on the objective of the image reconstruction, different optimization problems can be designed to incorporate different levels of knowledge about $B_1^+$ and $B_1^-$, as well as to incorporate measurement noise models.

Eqn. (2) results in a Fourier transform relationship between the magnetic resonance signal and the spin density function, $\rho$. Heterogeneity in the main magnetic field, $B_0$, and/or in $B_1$ can affect the quality of MR images through degradation and artifacts. For example, standing waves and interactions with the sample can produce constructive and destructive interference in $B_1^+$, leading to dark regions in the image. Using the signal model of Eqn. (2), an image pixel value in the image domain can be described as follows:

$$I_p(x,y)=h^+(x,y)m_{tx}D_p^-(x,y)\rho(x,y)+v(x,y) \qquad (5);$$

where $D_p$ is the $p^{th}$ RF element directivity at the location, (x,y); $h^+=[D_1, D_2, \ldots, D_p]$ is the array directivity at the location, (x,y); and $m_{tx}$ is an $n_c\times 1$ transmit excitation vector for $n_c$ RF elements (assuming the $n_c$ elements are operating in transmit-receive mode). The additive noise, v(x,y), can be assumed to be complex white Gaussian noise.

Eqn. (5) can be written in vector form for the $n_c$ receivers and a given transmit vector, $m_{tx}$, as, $$I(x,y)=h^+(x,y)m_{tx}H^-(x,y)\rho(x,y)+v(x,y) \qquad (6);$$

which can be written more compactly as $$I(x,y)=H^-(x,y)\rho(x,y)+v(x,y) \qquad (7);$$

with $$H^-(x,y)=h^+(x,y)m_{tx}h^-(x,y) \qquad (8).$$

It is noted that the compact form for the directivity vector does not assume anything about the heterogeneity of $B_1^+$; rather, it includes a complex constant, approximated by $h^+(x,y)m_{tx}$, with the receiver directivity vector, $h^-(\vec{r})$. The directivity vector can be computed using computational models, direct measurement if feasible, or based on estimates from the receive data under different conditions.

Eqn. (7) allows for estimating the spin density, $\rho$, using a linear least-mean-square estimator of $\rho$ given I(x,y), $$\hat{\rho}(x,y)=(R_\rho^{-1}+H^{-H}R_v^{-1}H^-)^{-1}H^{-H}R_v^{-1}I(x,y) \qquad (9).$$

When the noise, v, is white noise with a variance, $\sigma_v^2$, the solution to Eqn. (9) takes the following form:

$$\hat{\rho}(x,y)=\frac{H^{-H}}{\|H^-\|_2^2+SNR}I(x,y); \qquad (10)$$

which can be rewritten as, $$\hat{p}(x,y) = \frac{h^+(x,y)m_{tx}}{\|H^-\|_2^2 + SNR} \sum_{p=1}^{n_c} D_p^-(x,y) I_p(x,y); \quad (11)$$

where SNR=$\sigma_\rho^2/\sigma_v^2$ is signal-to-noise ratio. It is noted that the foregoing formulation can be generalized for multiple pixel locations and multiple transmissions (i.e., compounding). Eqn. (11) can be viewed as a regularized spatial inverse filter with respect to the transmit receive array directivity vector, H, as defined above. It is noted that this inverse filter does not remove nulls from any image associated with a single RF receive element; however, the denominator results in higher gain for low SNR and/or low directivity at certain pixel locations. This property provides an important advantage over previous SNR-aware methods, such as the adaptive reconstruction method described above. Before implementing the solution in Eqn. (11), the complex transmit vector, $m_{tx}$, must be evaluated.

It is possible to define an optimal synthesis problem for evaluating the complex transmit vector, $m_{tx}$, using information about the $B_1^+$ field profile for each transmit element. A set of control points, $n_f$, can be defined as points $(x_i, y_i)$ with $i=1, \ldots, n_f$. Assuming a linear propagation model, the $B_1^+(\vec{r}_i)$ field at the $i^{th}$ control point is given by $$B_1^+(\vec{r}_i) = \sum_{n=1}^{n_c} D_n^+(\vec{r}_i) m_{tx}[n], \, i=1, \ldots, n_f; \quad (12)$$

where the directivity values, $D_n^+(\vec{r}_i)$ can be computed, measured, or estimated.

Eqn. (12) can be rewritten in the following vector form, $$B_1^+ = H^+ m_{tx} \quad (13);$$

with the $n_f \times n_c$ matrix, $H^+$, representing a finite-dimensional propagation operator the describes propagation from a transmitter element to the control points, $\vec{r}_i$. Assuming that both $m_{tx}$ and $B_1^+$ are deterministic, a regularized minimum-norm least squares ("MNLS") solution to Eqn. (13) can be provided through the pseudoinverse, $$\hat{m}_{tx} = (H^+)^\dagger B_1^+ \quad (14).$$

The pseudoinverse in Eqn. (14) can be rewritten in a regularized weighted solution as follows, $$\hat{m}_{tx} = \begin{cases} WH^{+H}(H^+WH^{+H} + \Pi)^{-1} B_1^+ & n_f < n_c \\ (H^{+H}WH^+ + \Pi)^{-1} H^{+H} WB_1^+ & n_f > n_c; \end{cases} \quad (15)$$

where $\Pi$ is an appropriately designed regularization matrix and W is a weighting matrix determined by the optimization problem. Different variations on the MNLS solutions can be implemented depending on the objectives of the optimization and the nature of the propagation operator. For example, one variation on this solution includes nulling the $B_1^+$ field to reduce or eliminate artifacts. Eqn. (13) allows for two approaches to nulling.

The first approach for nulling the $B_1^+$ field is through direct nulling. In direct nulling, the $B_1^+$ field is set to $B_1^+(\vec{r}_i) = \delta$ with $|\delta| \approx 0$ for one or more control points in the field. The second approach for nulling the $B_1^+$ field is through soft nulling. In soft nulling, a weighted minimum-norm solution having the following form is sought:

$$\hat{m}_{tx} = R_c^{-1} H^{+H} (H^+ R_c^{-1} H^{+H})^{-1} B_1^+ \quad (16);$$

where $R_c^{-1}$ is a regularized inverse of array directivity matrix at a set of control points where the transmit field intensity is to be minimized. This matrix has the following form:

$$R_c^{-1} = (H_c^{+H} H_c^+ + \beta^2 I)^{-1} \quad (17);$$

where I is the identity matrix and $\beta$ is a regularization parameter. Eqn. (17) provides the solution to the following constrained optimization problem:

$$\min_{m_{tx}} \{m_{tx}^H H_c^{+H} H_c^+ m_{tx}\} \text{ subject to } B_1^+ = H^+ m_{tx}; \quad (18)$$

with $H^+$ as defined above in Eqn. (13). It is contemplated that the soft nulling approach implemented by Eqn. (18) will achieve better results than the direct nulling by specifying the values at the control points. It should be noted that the constrained optimization problem described above can be solved using norms other than the energy norm in Eqn. (18).

Receive beamforming can be performed as described above with respect to Eqns. (5)-(11) for a given solution to the transmit-beam synthesis described in above with respect to Eqns. (13)-(18). It is also possible, however, to define a mode of transmit-receive array beamforming known as synthetic-aperture beamforming. With this approach each RF coil or antenna is separately and individually used to transmit RF energy while magnetic resonance signals are detected and received by all of the RF coils or antennas. In this manner, for an RF element array having $n_c$ transmit-receive RF elements, which may be coils or antennas, $n_c^2$ complex images can be formed. These images are then combined into a single image where each pixel of the combined image is obtained with both transmit and receive arrays focused on that pixel, $$I(x,y) = \sum_{p=1}^{n_c} \sum_{q=1}^{n_c} D_p^+(x,y) D_q^-(x,y) C_{pq}(x,y); \quad (19)$$

where $C_{pq}(x,y)$ is the complex pixel value from the image formed by receiving on the $q^{th}$ RF receive element with the $p^{th}$ RF transmit element transmitting. Eqn. (19) can be written more compactly in terms of the transmit-receive array directivity vectors, as follows, $$I(x,y) = h_{xy}^{+T} C_{xy} h_{xy}^- \quad (20);$$

where $C_{xy}$ is an $n_c \times n_c$ matrix in which $C_{xy}(p,q)$ is the complex value at the point (x,y) in an image associated with the $p^{th}$ transmission and the $q^{th}$ reception.

The aforementioned synthetic aperture beamforming does not need to be performed at every pixel in the target image because, even at high $B_0$ field strengths, the array point spread function ("PSF") is approximately a Bessel function in the x-y plane with a main lobe spanning a number of image pixels. The composite image can be formed by a weighted sum, $$I(x, y) = \sum_{n=1}^{n_s} h_{x_n y_n}^{+T} C_{x_n y_n} h_{x_n y_n}^{-} W(x - x_n, y - y_n); \quad (21)$$

where $W(x,y)$ is a spatial compounding function designed to compensate for the high focusing gain of the RF coil or antenna array. By way of example, the spatial compounding function can be, $$W(x, y) = \frac{PSF(x, y)}{PSF^2(x, y) + \beta^2} \text{ for } x, y \in FOV. \quad (22)$$

That is, the spatial compounding function is the inverse of the PSF when $PSF^2(x,y) \gg \beta^2$, but goes to zero as $PSF(x,y)$ tends towards zero. The spatial weighting defined in Eqn. (22) can be modified to compensate for the known heterogeneity of the $B_1$ field.

Referring now to FIG. 1, a flowchart setting forth the steps of an example of a method for reconstructing an image using a beamforming technique that incorporates information about the directivity of the RF coil, or RF antenna, array elements is illustrated. The method begins with the acquisition of data using an array of RF elements, which may be RF coils or RF antenna, in an MRI system, as indicated at step 102. An image is then reconstructed for each RF receive element, as indicated at step 104. That is, an image is reconstructed from the signals acquired from each RF receive element. For instance, in an RF coil, or antenna, array having eight receive elements, eight different images are reconstructed. Directivity information about the RF elements in the array is provided, as indicated at step 106. This information may be computed, measured, or estimated. By way of example, the directivity information includes the directivity for each RF element, $D_p^-(x,y)$, at locations $(x,y)$ and the directivity information for the entire coil array, $H^-$, at those locations. Using the directivity information, the images associated with the different RF receive elements are combined to produce a target image of the subject, as indicated at step 108. By way of example, the individual images can be combined in accordance with Eqns. (10) or (11), or in accordance with Eqn. (21).

The beamforming methods of the present invention provide the advantage that contrast can be restored in regions where spin levels are reduced because of $B_1$ non-uniformities. Compared to standard approaches, like RSS, the present invention can be designed to balance the local SNR with the array directivity at each pixel to minimize the extent of the dark regions in the reconstructed images.

The beamforming approach utilizes the RF coil, or antenna, directivities, together with the local SNR, to generate a pixel-wise gain function for equalizing the images in receive-only beamforming reconstructions. The local SNR can be estimated using a no-transmit reception with the subject in the magnet. The equalization can be selectively applied, such as if the SNR is above a specified threshold; otherwise, the values of the complex image pixels can remain unaltered. This resulted in minimizing, but not eliminating the dark regions in the reconstruction. Therefore, with the current technique, it may not be possible to generate full images using one transmit element except when the SROI does not contain any nulls. However, as few as two transmissions could be used to produce a potentially useful image when the transmitting elements do not have common nulls. In this scenario, as in the single-element transmit scenarios, the receive-only beamforming compounding provides a superior result compared with the corresponding compounding solution with the RSS.

In principle, the transmit-receive (synthetic aperture) beamforming can be applied in a similar manner to the RX-only BF approach. Images can be added together using spatial weighting functions that attempt to equalize the RF coil, or antenna, array gain around the focal point. Local SNR is not used in these instances, but the algorithm can be readily adapted to incorporate local SNR in the compounding. For example, the two-way focusing gain could be modified to account for the local SNR in a manner similar to the receive-only beamforming described above. Alternately, the complex images from individual transmit-receive combinations can be modified by pixel-wise weighting based on the measured SNR.

The propagation operators that form the basis of the beamforming formulation described above have several extensions that can be advantageous in pMRI applications. For example, mutual coupling between the transmit or receive elements can be incorporated in the propagation operators, $H^+$ and $H^-$ coupling matrix of size $n_c \times n_c$ can be cascaded with the appropriate operator and the synthesis problem can be solved for the cascade.

Explicitly accounting for RF receive coil, or antenna, array and/or RF transmit-receive coil, or antenna, array directivity in pMRI provides improvements in image contrast compared to conventional approaches, like RSS, that rely only on the measured complex image and noise data. RF receive element data can be used in receive-only beamforming or in synthetic-aperture transmit-receive beamforming.

Figure 2:
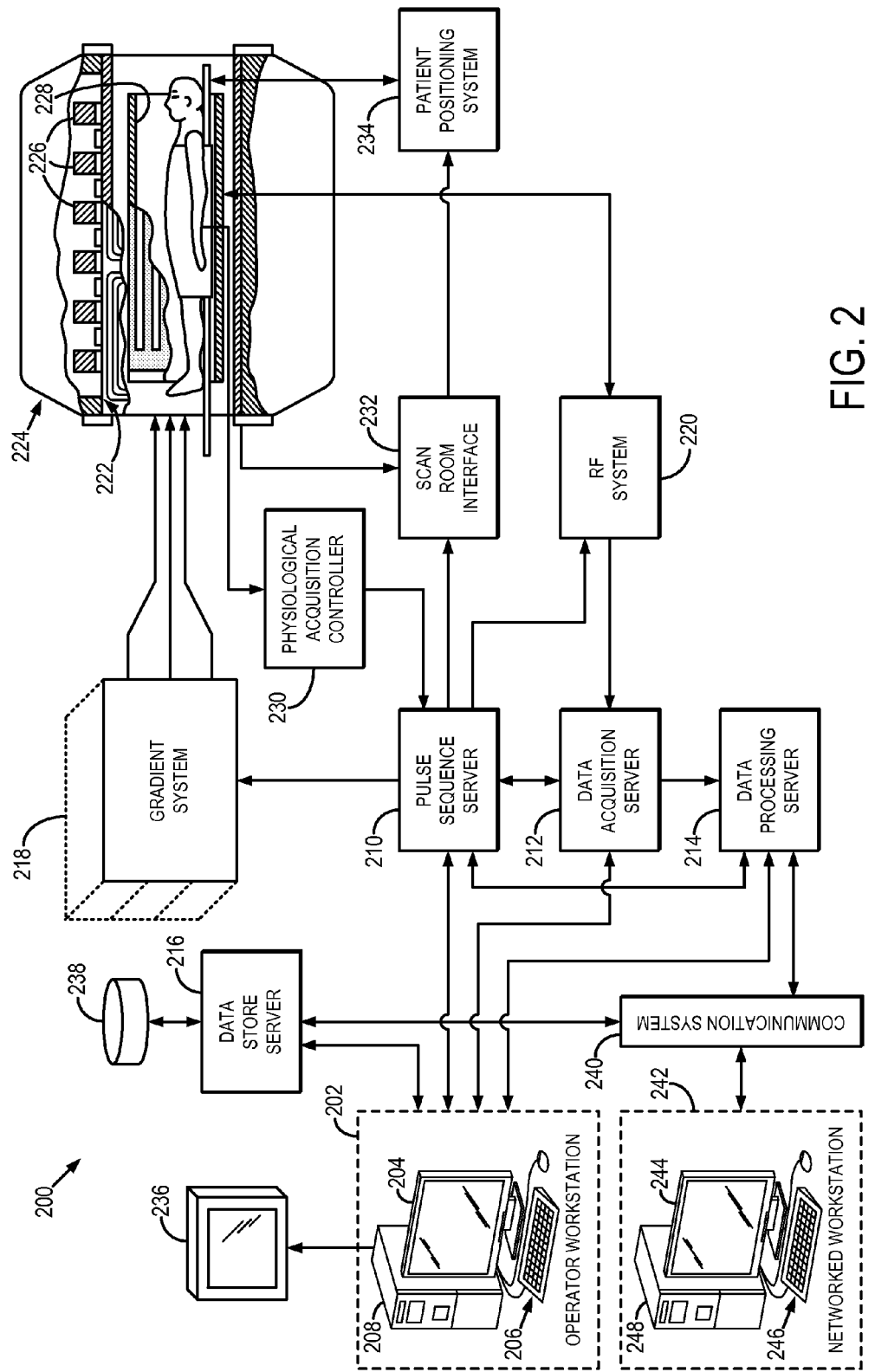
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes a workstation 202 having a display 204 and a keyboard 206. The workstation 202 includes a processor 208, such as a commercially available programmable machine running a commercially available operating system. The workstation 202 provides the operator interface that enables scan prescriptions to be entered into the MRI system 200. The workstation 202 is coupled to four servers: a pulse sequence server 210; a data acquisition server 212; a data processing server 214; and a data store server 216. The workstation 202 and each server 210, 212, 214, and 216 are connected to communicate with each other.

The pulse sequence server 210 functions in response to instructions downloaded from the workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding MR signals. The gradient coil assembly 222 forms part of a magnet assembly 224 that includes a polarizing magnet 226 and a whole-body RF coil 228.

RF excitation waveforms are applied to the RF coil 228, or a separate local coil (not shown in FIG. 2), by the RF system 220 to perform the prescribed magnetic resonance pulse sequence. Responsive MR signals detected by the RF coil 228, or a separate local coil (not shown in FIG. 2), are received by the RF system 220, amplified, demodulated, filtered, and digitized under direction of commands produced by the pulse sequence server 210. The RF system 220 includes an RF transmitter for producing a wide variety of RF pulses used in MR pulse sequences. The RF transmitter is responsive to the scan prescription and direction from the pulse sequence server 210 to produce RF pulses of the desired frequency, phase, and pulse amplitude waveform. The generated RF pulses may be applied to the whole body RF coil 228 or to one or more local coils or coil arrays (not shown in FIG. 2).

The RF system 220 also includes one or more RF receiver channels. Each RF receiver channel includes an RF preamplifier that amplifies the MR signal received by the coil 228 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (23);$$

and the phase of the received MR signal may also be determined:

$$\varphi = \tan^{-1}\left(\frac{Q}{I}\right). \quad (24)$$

The pulse sequence server 210 also optionally receives patient data from a physiological acquisition controller 230. The controller 230 receives signals from a number of different sensors connected to the patient, such as electrocardiograph ("ECG") signals from electrodes, or respiratory signals from a bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized MR signal samples produced by the RF system 220 are received by the data acquisition server 212. The data acquisition server 212 operates in response to instructions downloaded from the workstation 202 to receive the real-time MR data and provide buffer storage, such that no data is lost by data overrun. In some scans, the data acquisition server 212 does little more than pass the acquired MR data to the data processor server 214. However, in scans that require information derived from acquired MR data to control the further performance of the scan, the data acquisition server 212 is programmed to produce such information and convey it to the pulse sequence server 210. For example, during prescans, MR data is acquired and used to calibrate the pulse sequence performed by the pulse sequence server 210. Also, navigator signals may be acquired during a scan and used to adjust the operating parameters of the RF system 220 or the gradient system 218, or to control the view order in which k-space is sampled. In all these examples, the data acquisition server 212 acquires MR data and processes it in real-time to produce information that is used to control the scan.

The data processing server 214 receives MR data from the data acquisition server 212 and processes it in accordance with instructions downloaded from the workstation 202. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 214 are conveyed back to the workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the workstation 202. The workstation 202 may be used by an operator to archive the images, produce films, or send the images via a network to other facilities.

Figure 3:
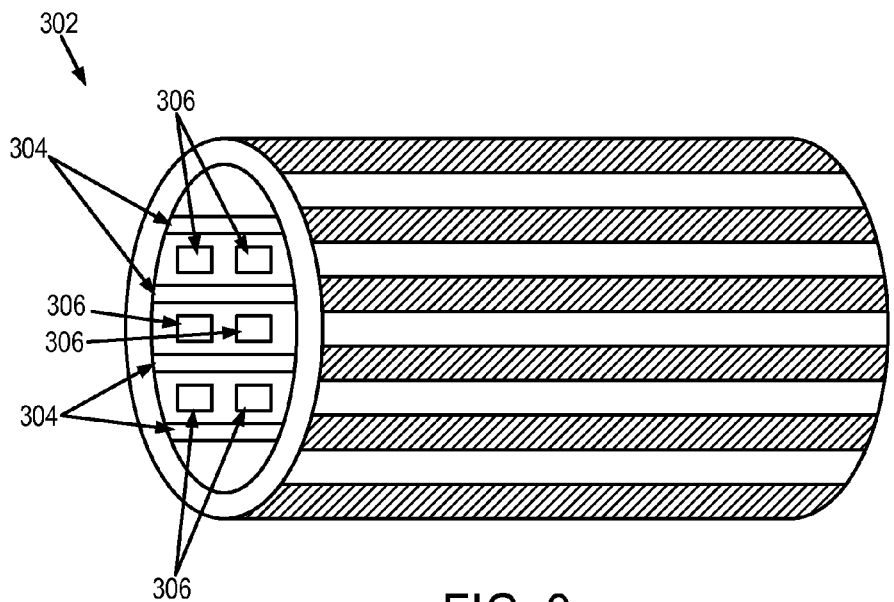
FIG. 3 is an example of an array of RF coils that can be implemented when practicing the present invention.

An example of an RF coil that can be used when practicing the present invention is illustrated in FIG. 3. The coil 302 includes microstrip transmit elements 304 and coils 306 as antennas for the receiver elements. The active receive coil element module includes a receive antenna, a transmit/receive switch to protect the receiver from the transmit pulse, an amplifier, a down-convertor and filter for the received signals to be converted to an intermediate frequency ("IF") such as 20 MHz, an amplifier to obtain the in-phase and quadrature channels to preserve the phase information, and analog-to-digital converters. With these receive element signals, the beam forming signals are now in the digital domain and allow the processing with the phase information. Alternatives to the transmit microstrip 304 and receive coil antennas 306, including metamaterial designs, can also be implemented.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
    a) acquiring data from the subject using an MRI system by generating radio frequency (RF) energy with at least one transmit RF element and measuring magnetic resonance signals formed in response thereto with at least two receive RF elements;
    b) determining a directivity for each of the at least two receive RF elements;
    c) reconstructing an image corresponding to each of the at least two receive RF elements by reconstructing data acquired in step a) by the respective receive RF element; and
    e) producing an image of the subject by combining the images reconstructed in step c) using the directivities for the at least two receive RF elements.

2. The method as recited in claim 1 in which step e) includes estimating a local signal-to-noise ratio (SNR) and using the local SNR when combining the images reconstructed in step c).

3. The method as recited in claim 2 in which step e) includes computing an inverse spatial filter using the directivities and the local SNR, and applying the inverse spatial filter to the images reconstructed in step c).

4. The method as recited in claim 1 in which step e) includes weighting the images reconstructed in step c) using the directivities determined in step b).

5. The method as recited in claim 1 in which step b) further includes determining a directivity for each of the at least one transmit RF elements.

6. The method as recited in claim 5 in which step e) includes weighting the images reconstructed in step c) using the directivities determined in step b).

7. The method as recited in claim 6 in which step e) includes calculating a weighted sum that includes weighting each image reconstructed in step c) with the directivity for the transmit RF element and the directivity for the receive RF element used to acquire the data in step a) associated with the given image.

8. The method as recited in claim 7 in which the weighted sum calculated in step e) further includes applying a spatial compounding function to each image reconstructed in step c), the spatial compounding function being designed to at least one of compensate for focusing gain of the at least two receive RF elements and equalize focusing gain in a specified region-of-interest.

9. The method as recited in claim 1 in which step b) includes at least one of computing the directivities using a model; measuring the directivities; and estimating the directivities.

10. The method as recited in claim 1 in which the at least one transmit RF element includes at least one of an RF coil and an RF antenna, and in which the at least two receive RF elements include at least one of RF coils and RF antennas.

11. A method for producing an image of a subject with a magnetic resonance imaging (MRI) system that includes an array of radio frequency (RF) elements, the steps of the method comprising:
   a) transmitting RF energy to the subject using the array of RF elements;
   b) acquiring data with the array of RF elements by measuring magnetic resonance signals formed in response to the RF energy transmitted in step a);
   c) providing a transmit directivity and a receive directivity for each RF element in the array of RF elements;
   d) reconstructing an image for each coil in the array of RF elements by reconstructing data acquired in step a) associated with magnetic resonance signals detected by the respective RF element; and
   e) producing an image of the subject by combining the images reconstructed in step d) using the directivities provided in step c).

12. The method as recited in claim 11 in which steps a) and b) are repeated to acquire multiple sets of data, and each performance of step a) includes transmitting RF energy with at least one of the RF elements in the array of RF elements.

13. The method as recited in claim 12 in which step e) includes weighting the images reconstructed in step d) using the directivities provided in step c).

14. The method as recited in claim 12 in which step e) includes providing a directivity of the array of RF elements based on the directivities provided in step c), and further includes weighting the images reconstructed in step d) using the directivity of the array of RF elements.

15. The method as recited in claim 12 in which step e) includes calculating a weighted sum that includes weighting each image reconstructed in step d) with the directivity for the RF element used to transmit RF energy in step a) and the directivity for the RF element used to acquire the data in step b) associated with the given image.

16. The method as recited in claim 13 in which the weighted sum calculated in step e) further includes applying a spatial compounding function to each image reconstructed in step d), the spatial compounding function being designed to compensate for focusing gain of the array of RF elements.

17. The method as recited in claim 13 in which the weighted sum calculated in step e) further includes applying a spatial compounding function to each image reconstructed in step d), the spatial compounding function being designed to compensate for $B_1$ field heterogeneity.

18. The method as recited in claim 11 in which step a) includes transmitting RF energy using each RF elements in the array of RF elements.

19. The method as recited in claim 11 in which step c) includes at least one of computing the directivities using a model; measuring the directivities; and estimating the directivities.

20. The method as recited in claim 11 in which the array of RF elements is at least one of an array of RF coils and an array of RF antennas.

* * * * *